US008270219B2

(12) United States Patent
Joo

(10) Patent No.: US 8,270,219 B2
(45) Date of Patent: Sep. 18, 2012

(54) METHOD OF OPERATING NONVOLATILE MEMORY DEVICE CAPABLE OF READING TWO PLANES

(75) Inventor: Byoung In Joo, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 265 days.

(21) Appl. No.: 12/826,936

(22) Filed: Jun. 30, 2010

(65) Prior Publication Data

US 2010/0329018 A1 Dec. 30, 2010

(30) Foreign Application Priority Data

Jun. 30, 2009 (KR) .................. 10-2009-0059151

(51) Int. Cl.
*G11C 16/04* (2006.01)

(52) U.S. Cl. .......... 365/185.18; 365/185.03; 365/185.21

(58) Field of Classification Search ............. 365/185.18, 365/185.03, 185.21, 185.19, 189.03
See application file for complete search history.

(56) References Cited

U.S. PATENT DOCUMENTS 7,630,246 B2 * 12/2009 Roohparvar ............. 365/185.18

FOREIGN PATENT DOCUMENTS

KR 1020080056586 A 6/2008

* cited by examiner

*Primary Examiner* — David Lam
(74) *Attorney, Agent, or Firm* — William Park & Associates Ltd.

(57) ABSTRACT

A nonvolatile memory device is operated by receiving a dual plane read command for simultaneously reading first and second planes, each comprising memory cells, receiving an MSB read address for reading data stored in the memory cells, checking whether an MSB program operation has been performed on each of the first and second planes, and performing the read operation on the first and second planes according to a result of the check and outputting the read data.

17 Claims, 4 Drawing Sheets

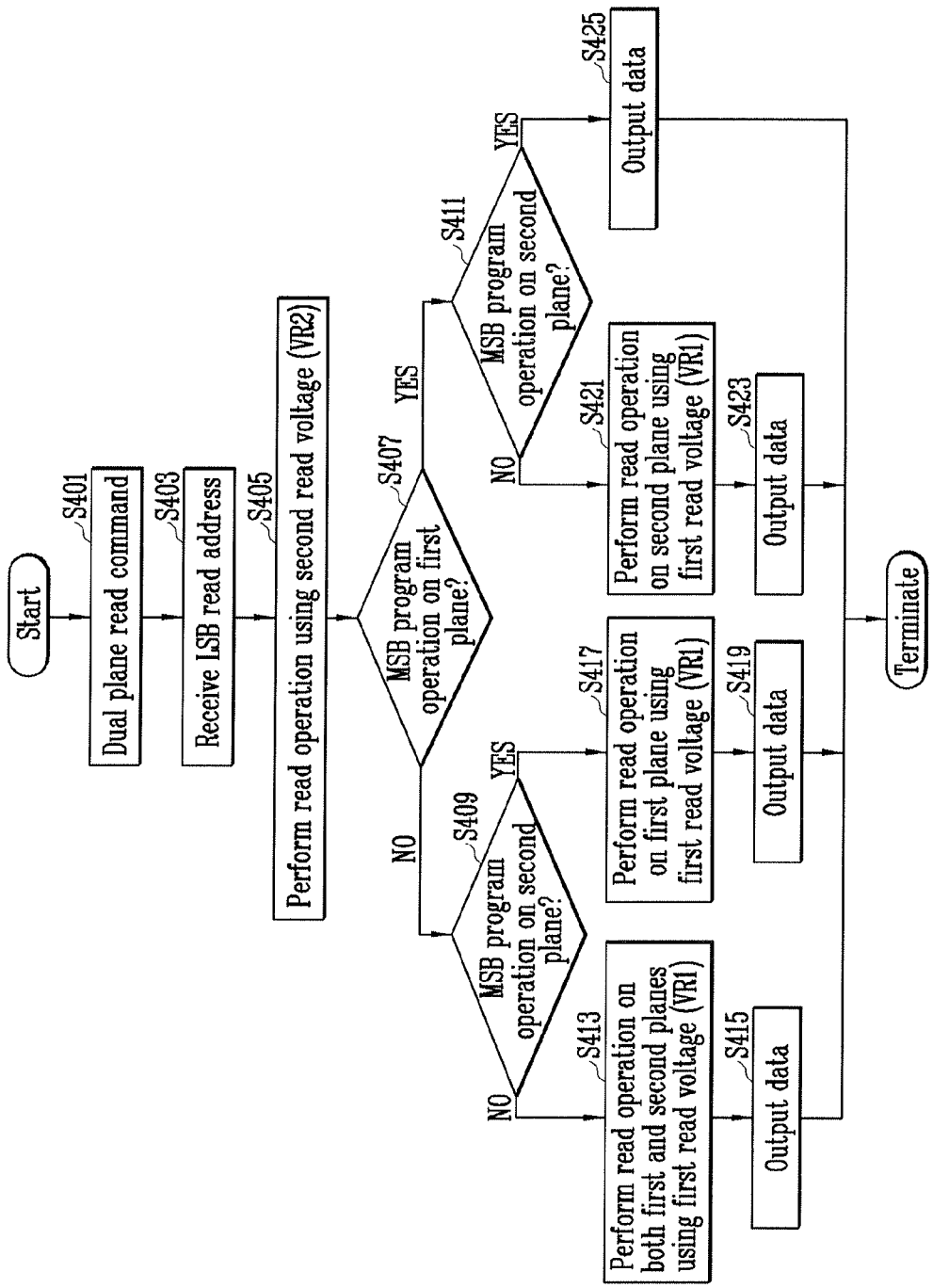

METHOD OF OPERATING NONVOLATILE MEMORY DEVICE CAPABLE OF READING TWO PLANES

CROSS-REFERENCE TO RELATED APPLICATION

Priority to Korean patent application number 10-2009-0059151 filed on Jun. 30, 2009, the entire disclosure of which is incorporated by reference herein, is claimed.

BACKGROUND

Exemplary embodiments relate generally to a method of operating a nonvolatile memory device, and more particularly to a method of operating a nonvolatile memory device which is capable of reading two planes at the same time.

Electrically programmable and erasable nonvolatile memory devices which do not require refresh function of rewriting data at specific intervals are increasingly in demand.

A nonvolatile memory device typically includes a plane having a number of memory blocks. However, nonvolatile memory devices having a multi-plane structure having a number of planes are increasingly more in use.

Several operations are performed in a nonvolatile memory device such as: a program operation for writing data in a memory cell, a read operation for reading data stored in a memory cell, an erase operation for erasing data stored in a memory cell, and so on.

A multi-level cell (hereinafter referred to as "the MLC") program method is a program method of storing information of 2 bits or more in one cell. In a single level cell (hereinafter referred to as "the SLC") program method, two states with different threshold voltages are produced by a program operation. In the MLC program method, however, the above program operation is repeatedly performed to store information of 2 bits or more. In the MLC program operation, a least significant bit (hereinafter referred to as "the LSB") program operation and a most significant bit (hereinafter referred to as "the MSB") program operation are performed.

When data is read from two planes at the same time, a read operation is performed on the two planes only when the same program operation has been performed on the two planes. That is, only when the MSB program operation has been performed on the two planes or the LSB program operation has been performed on the two planes, the read operation is performed on the two planes at the same time. After the program operation is performed on the two planes so that they have the same program states, the read operation is then performed on the two planes. This presents many problems one of which, inter alia, is that, if the two planes have different program states, the read operation cannot be performed on the two planes at the same time.

BRIEF SUMMARY

Exemplary embodiments relate to a method of operating a nonvolatile memory device, which is capable of performing a read operation on two planes in the case in which the two planes are programmed to have different MSB program states.

A method of operating a nonvolatile memory device according to an aspect of the present disclosure comprises receiving a dual plane read command for simultaneously reading first and second planes, each comprising memory cells, receiving an MSB read address for reading data stored in the memory cells, checking whether an MSB program operation has been performed on each of the first and second planes, and performing the read operation on the first and second planes according to a result of the check and outputting the read data.

Checking whether an MSB program operation has been performed on each of the first and second planes is performed based on information read from a flag cell of each of the first and second planes.

The method further comprises, after receiving the MSB read address, performing the read operation on the first and second planes on the basis of a first read voltage for reading memory cells having a lowest threshold voltage distribution, from among memory cells on which an MSB program operation has been performed, and storing the read data in respective page buffers of the first and second planes.

Performing the read operation on the first and second planes according to a result of the check and outputting the read data comprises resetting the data stored in the page buffers and outputting the reset data, if, as a result of the check, the MSB program operation has not been performed on both the first and second planes.

Performing the read operation on the first and second planes according to a result of the check and outputting the read data comprises performing the read operation on the first and second planes on the basis of a number of read voltages other than the first read voltage, if, as a result of the check, the MSB program operation has been performed on both the first and second planes.

Performing the read operation on the first and second planes according to a result of the check and outputting the read data comprises performing the read operation on the second plane on the basis of a number of read voltages other than the first read voltage, outputting the read data, resetting the data stored in the page buffer of the first plane, and outputting the reset data, if, as a result of the check, the MSB program operation has not been performed on the first plane, but has been performed on the second plane.

Performing the read operation on the first and second planes according to a result of the check and outputting the read data comprises performing the read operation on the first plane on the basis of a number of read voltages other than the first read voltage, outputting the read data, resetting the data stored in the page buffer of the second plane, and outputting the reset data, if, as a result of the check, the MSB program operation has been performed on the first plane, but has not been performed on the second plane.

A method of operating a nonvolatile memory device according to an aspect of the present disclosure comprises receiving a dual plane read command for simultaneously reading first and second planes, each comprising memory cells, receiving an LSB read address for reading data stored in the memory cells, checking whether an MSB program operation has been performed on each of the first and second planes, and performing the read operation on the first and second planes according to a result of the check and outputting the read data.

Checking whether an MSB program operation has been performed on each of the first and second planes is performed based on information read from a flag cell of each of the first and second planes.

The method further comprises, after receiving the LSB read address, performing the read operation on the first and second planes on the basis of a second read voltage for reading data of LSB components from memory cells on which an MSB program operation has been performed and storing the read data in respective page buffers of the first and second planes.

Performing the read operation on the first and second planes according to a result of the check and outputting the read data comprises performing the read operation on the first and second planes on the basis of a read voltage for reading memory cells on which an LSB program operation has been performed and outputting the read data, if, as a result of the check, the MSB program operation has not been performed on both the first and second planes.

Performing the read operation on the first and second planes according to a result of the check and outputting the read data comprises outputting the data stored in the page buffers of the first and second planes, if, as a result of the check, the MSB program operation has been performed on both the first and second planes.

Performing the read operation on the first and second planes according to a result of the check and outputting the read data comprises performing the read operation on the first plane on the basis of a read voltage for reading memory cells on which an LSB program operation has been performed, outputting the read data, and outputting the data stored in the page buffer of the second plane, if, as a result of the check, the MSB program operation has not been performed on the first plane, but has been performed on the second plane.

Performing the read operation on the first and second planes according to a result of the check and outputting the read data comprises the read operation on the second plane on the basis of a read voltage for reading memory cells on which an LSB program operation has been performed, outputting the read data, and outputting the data stored in the page buffer of the first plane, if, as a result of the check, the MSB program operation has been performed on the first plane, but has not been performed on the second plane.

BRIEF DESCRIPTION OF THE DRAWINGS

FIG. 4 is a flowchart illustrating a method of operating the nonvolatile memory device according to another embodiment of this disclosure.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of embodiments of the disclosure.

Figure 1:
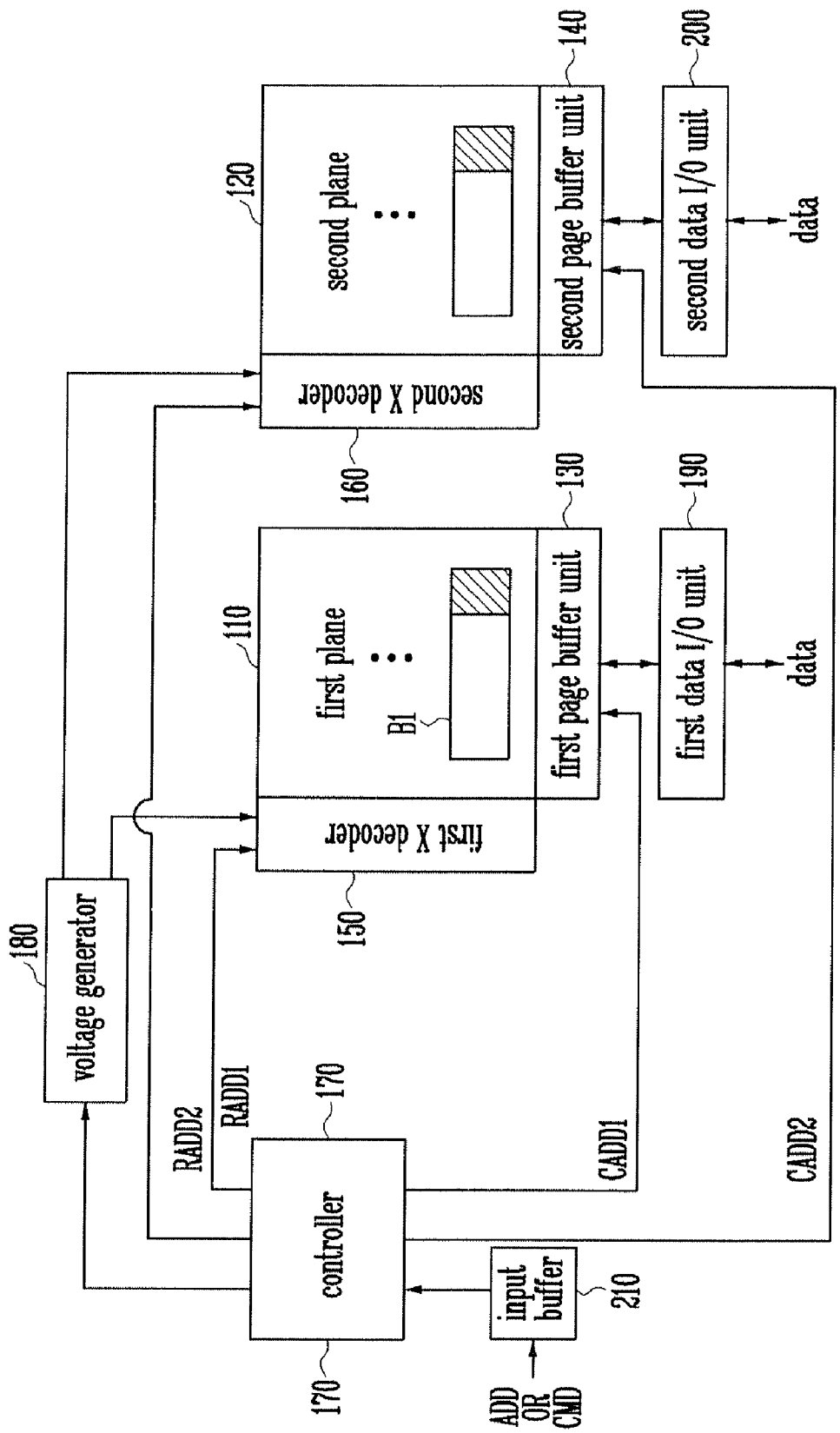
FIG. 1 is a block diagram of a nonvolatile memory device according to an embodiment of this disclosure.

FIG. 1 is a block diagram of a nonvolatile memory device according to an embodiment of this disclosure.

Referring to FIG. 1, the nonvolatile memory device according to an embodiment of this disclosure includes a first plane 110, a second plane 120, a first page buffer unit 130, a second page buffer unit 140, a first X decoder 150, a second X decoder 160, a controller 170, a voltage generator 180, a first data I/O unit 190, a second data I/O unit 200, and an input buffer 210.

Program, read, and erase operations are performed on the first plane 110 by the first page buffer unit 130 coupled to the first plane 110. Likewise, program, read, and erase operations are performed on the second plane 120 by the second page buffer unit 140 coupled to the second plane 120. Each of the first plane 110 and the second plane 120 includes a number of memory blocks. The first plane 110 is illustrated to include, for example, a first memory block B1 in FIG. 1. The memory block includes memory cells for storing data and flag cells for storing information indicative of whether an MSB program has been performed. Oblique lines as shown in FIG. 1 in the first plane 110 and the second plane 120 indicate the flag cells.

The controller 170 controls a variety of operations of the nonvolatile memory device such as the program operation, the read operation, the erase operation, and so on. More particularly, the controller 170 receives an external address ADD via the input buffer 210, outputs a first row address RADD1 to the first X decoder 150, outputs a second row address RADD2 to the second X decoder 160, outputs a first column address CADD1 to the first page buffer unit 130, and outputs a second column address CADD2 to the second page buffer unit 140.

Further, the controller 170 receives an external command CMD via the input buffer 210 and controls the voltage generator 180 so that it supplies high voltages for the various operations of the first plane 110 and the second plane 120.

The first data I/O unit 190 functions to transfer external input data to the first page buffer 130 or to output data stored in the first page buffer 130 externally.

The second data I/O unit 200 functions to transfer external input data to the second page buffer 140 or to output data stored in the second page buffer 140 externally.

Figure 2:
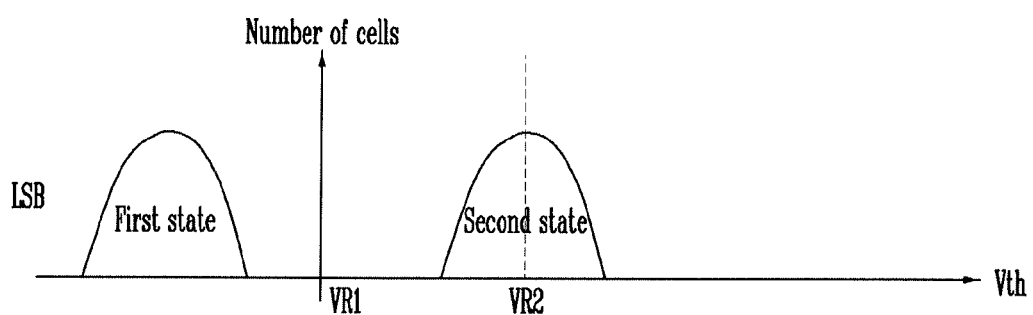
FIG. 2 is a diagram showing the distributions of the threshold voltages of memory cells according to an embodiment of this disclosure.
Figure 2:
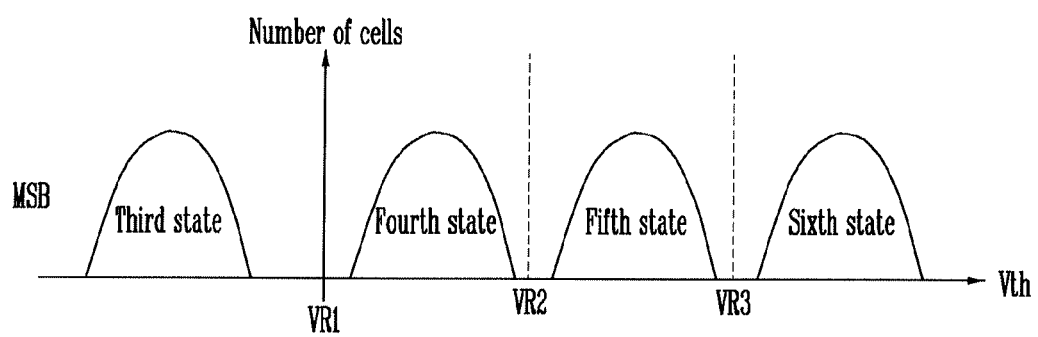

FIG. 2 is a diagram showing the distributions of the threshold voltages of memory cells according to an embodiment of this disclosure.

Referring to FIG. 2, in an LSB program operation, two distributions with different program states are produced by the program operation. More particularly, a distribution of the threshold voltages of memory cells programmed with higher than a first read voltage VR1 is referred to as a second state, and a distribution of the threshold voltages of memory cells programmed with less than the first read voltage VR1 is referred to as a first state.

In the state in which the LSB program operation has been performed as described above, an MSB program operation is performed. Distributions of the threshold voltages with four different program states, for example, third to sixth states, are produced by the MSB program operation. Here, the distributions of the threshold voltages are higher in the order of the third state, the fourth state, the fifth state, and the sixth state as shown in FIG. 2. The distribution of the threshold voltages having the sixth state is produced using a read voltage higher than a third read voltage VR3. The distribution of the threshold voltages having the fifth state is produced using a read voltage higher than a second read voltage VR2, but less than the third read voltage VR3. The distribution of the threshold voltages having the fourth state is produced using a read voltage higher than a first read voltage VR1, but less than the second read voltage VR2. The distribution of the threshold voltages having the third state is produced using a read voltage less than a first read voltage VR1.

In an embodiment of the present disclosure, to check whether only an LSB program operation or only an MSB program operation has been performed on a programmed page, the flag cell is used. Data indicating whether the MSB program operation has been performed on the corresponding page is stored in the flag cell. For example, during the LSB program operation, a program operation may not be performed on the flag cell, but during the MSB program operation, the program operation may be performed on the flag cell.

Accordingly, whether the MSB program operation has been performed can be checked by reading data stored in the flag cell.

Figure 3:
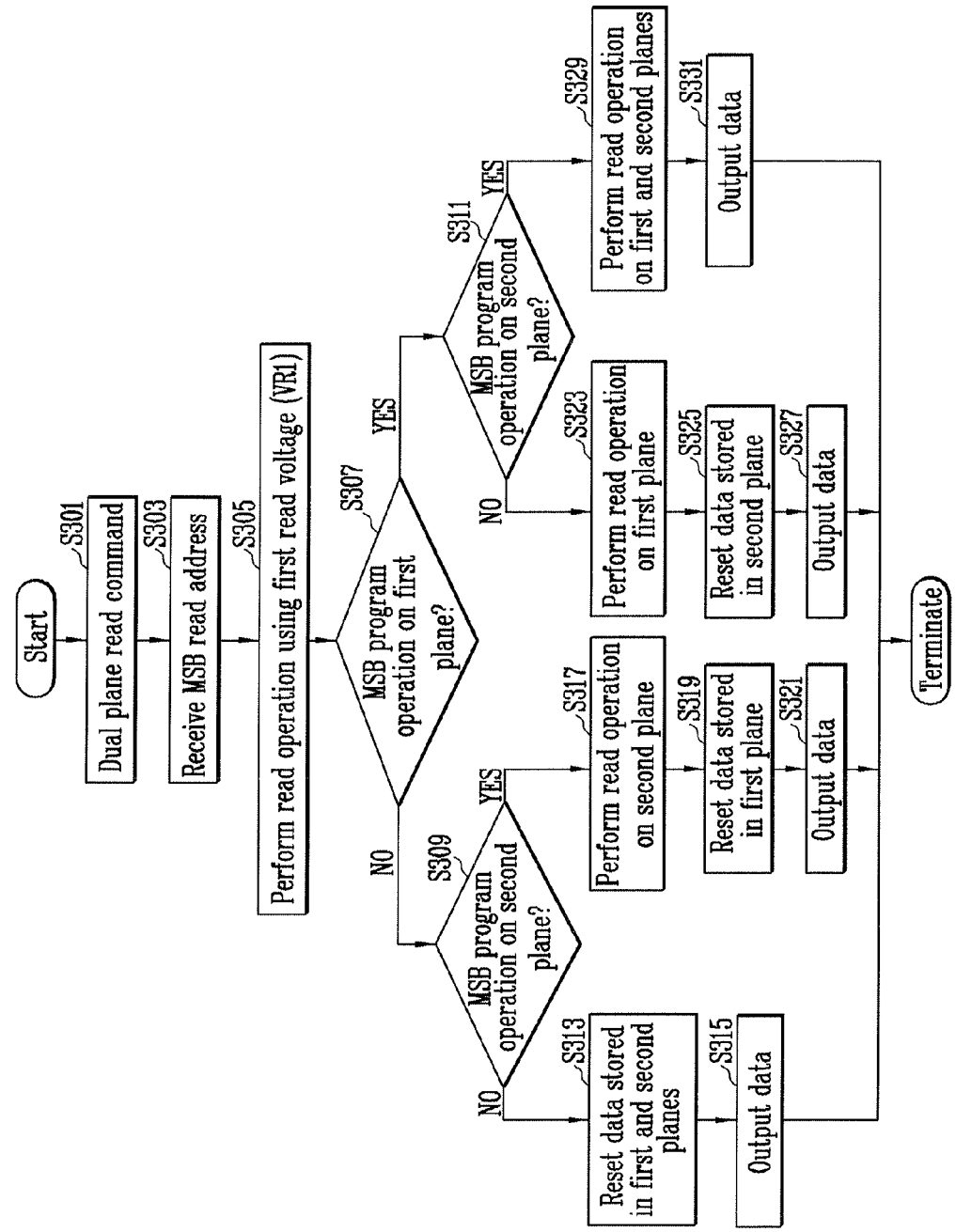
FIG. 3 is a flowchart illustrating a method of operating the nonvolatile memory device according to an embodiment of this disclosure.

FIG. 3 is a flowchart illustrating a method of operating the nonvolatile memory device according to an embodiment of this disclosure. The method of operating the nonvolatile memory device is described below with reference with FIG. 3 together with FIGS. 1 and 2.

A dual plane read command for reading the first plane 110 and the second plane 120 at the same time is received at step S301. For example, the dual plane read command can be received through the input buffer 210, and the controller 170 can perform the read operation on the first plane 110 and the second plane 120 in response to the dual plane read command.

An MSB read address for reading data stored in MSB-programmed memory cells is received at step S303. For example, the MSB read address can be received through the input buffer 210. In an embodiment of the present disclosure, the MSB read address has a larger number of bits than an LSB read address. Thus, the controller 170 can determine whether a received address is the MSB read address or the LSB read address, for example, on the basis of the number of bits of the received address.

The controller 170 performs the read operation on the first plane 110 and the second plane 120 on the basis of a first read voltage VR1 at step S305. The read data is stored in the first page buffer unit 130 and the second page buffer unit 140.

It is determined whether an MSB program operation has been performed on the first plane 110 at step S307. It is determined whether an MSB program operation has been performed the second plane 120 at steps S309 and S311. In an embodiment of this disclosure, whether the MSB program operation has been performed can be checked by reading data stored in the flag cells of the first plane 110 and the second plane 120.

The following four cases are then possible according to whether the MSB program operation has been performed on the first plane 110 and/or the second plane 120.

The first case (S313, S315) corresponds to a state in which the MSB program operation has not been performed on both the first plane 110 and the second plane 120. In this case, the data stored in the first page buffer unit 130 of the first plane 110 and the data stored in the second page buffer unit 140 of the second plane 120 are reset at step S313. The pieces of reset data are output through the first data I/O unit 190 and the second data I/O unit 200, respectively, at step S315. For example, the data stored in the first page buffer unit 130 and the second page buffer unit 140 can be reset to 1 and then outputted.

The second case (S317, S319, S321) corresponds to a state in which the MSB program operation has not been performed on the first plane 110 but has been performed on the second plane 120. In this case, the read operation is performed on the second plane 120 on the basis of a second read voltage VR2 and a third read voltage VR3 at step S317. The data stored in the first page buffer 130 of the first plane 110 is reset at step S319. The data stored in the first page buffer unit 130 and the data stored in the second page buffer unit 140 are respectively outputted through the first data I/O unit 190 and the second data I/O unit 200 at step S321.

The third case (S323, S325, S327) corresponds to a state in which the MSB program operation has been performed on the first plane 110 but has not been performed on the second plane 120. In this case, the read operation is performed on the first plane 110 on the basis of a second read voltage VR2 and a third read voltage VR3 at step S323. The data stored in the second page buffer 140 of the second plane 120 is reset at step S325. The data stored in the first page buffer unit 130 and the data stored in the second page buffer unit 140 are respectively outputted through the first data I/O unit 190 and the second data I/O unit 200 at step S327.

The fourth case (S329, S331) corresponds to a state in which the MSB program operation has been performed on both the first plane 110 and the second plane 120. In this case, the read operation is performed on both the first plane 110 and the second plane 120 on the basis of a second read voltage VR2 and a third read voltage VR3 at step S329. The data stored in the first page buffer unit 130 and the data stored in the second page buffer unit 140 are respectively outputted through the first data I/O unit 190 and the second data I/O unit 200 at step S331.

FIG. 4 is a flowchart illustrating a method of operating the nonvolatile memory device according to another embodiment of this disclosure.

A dual plane read command for reading the first plane 110 and the second plane 120 at the same time is received at step S401. For example, the dual plane read command can be received through the input buffer 210, and the controller 170 can perform the read operation on the first plane 110 and the second plane 120 in response to the dual plane read command.

An LSB read address for reading data of LSB components is received at step S403. For example, the LSB read address can be received through the input buffer 210. In an embodiment of the present disclosure, the LSB read address has the number of bits smaller than an MSB read address. Thus, the controller 170 can determine whether a received address is the MSB read address or the LSB read address on the basis of the number of bits of the received address.

The controller 170 performs the read operation on the first plane 110 and the second plane 120 on the basis of a second read voltage VR2 at step S405. The read data is stored in the first page buffer unit 130 and the second page buffer unit 140.

It is determined whether the MSB program operation has been performed on the first plane 110 at step S407. It is determined whether the MSB program operation has been performed the second plane 120 at steps S409 and S411. In an embodiment of this disclosure, whether the MSB program operation has been performed can be checked, for example, by reading data stored in the flag cells of the first plane 110 and the second plane 120.

The following four cases are then possible according to whether the MSB program operation has been performed on the first plane 110 and the second plane 120 according to an embodiment of this disclosure.

The first case (S413, S415) corresponds to a state in which the MSB program operation has not been performed on both the first plane 110 and the second plane 120. In this case, the read operation is performed on the first plane 110 and the second plane 120 on the basis of a first read voltage VR1, and the read data is stored in the first page buffer unit 130 and the second page buffer unit 140 at step S413. The data stored in the first page buffer unit 130 and the data stored in the second page buffer unit 140 are respectively outputted through the first data I/O unit 190 and the second data I/O unit 200 at step S415.

The second case (S417, S419) corresponds to a state in which the MSB program operation has not been performed on the first plane 110 but has been performed on the second plane 120. In this case, the read operation is performed on the first plane 110 on the basis of a first read voltage VR1 and the read data stored in the first page buffer 130 at step S417. The data stored in the first page buffer unit 130 and the data stored in the second page buffer unit 140 are respectively outputted through the first data I/O unit 190 and the second data I/O unit 200 at step S419. At step S419, the second page buffer unit 140 coupled to the second plane 120 stores the data read by the read operation on the basis of the second read voltage VR2 and output the stored data. Since the MSB program operation has been performed on the second plane 120, the second page buffer unit 140 stores the data of LSB components and outputs the stored data.

The third case (S421, S423) corresponds to a state in which the MSB program operation has been performed on the first plane 110 but has not been performed on the second plane 120. In this case, the read operation is performed on the second plane 120 on the basis of a first read voltage VR1, and the read data is stored in the second page buffer 140 at step S421. The data stored in the first page buffer unit 130 and the data stored in the second page buffer unit 140 are respectively outputted through the first data I/O unit 190 and the second data I/O unit 200 at step S423. At step S423, the first page buffer unit 130 coupled to the first plane 110 stores the data read by the read operation on the basis of a second read voltage VR2 and outputs the stored data. Since the MSB program operation has been performed on the first plane 110, the first page buffer unit 130 stores the data of LSB components and outputs the stored data.

The fourth case (S425) corresponds to a state in which the MSB program operation has been performed on both the first plane 110 and the second plane 120. In this case, the data stored in the first page buffer unit 130 and the data stored in the second page buffer unit 140 are respectively outputted through the first data I/O unit 190 and the second data I/O unit 200 at step S425. At step S425, the first page buffer unit 130 coupled to the first plane 110 and the second page buffer unit 140 coupled to the second plane 120 store the pieces of data read by the read operation on the basis of a second read voltage VR2 and output the data. Since the MSB program operation has been performed on the first plane 110 and the second plane 120, the first page buffer unit 130 and the second page buffer unit 140 store the data of LSB components and output the stored data.

In accordance with embodiments of the present disclosure, the read operation for reading two planes at the same time can be performed irrespective of whether an MSB program operation has been performed on each of the planes. Accordingly, malfunctions are prevented which can occur because two planes on which a read operation will be performed have different MSB program operation states.

What is claimed is:

1. A method of operating a nonvolatile memory device, the method comprising:
   receiving a dual plane read command for simultaneously reading first and second planes, each comprising memory cells;
   receiving a read address for reading data stored in the memory cells;
   checking whether an MSB program operation has been performed on each of the first and second planes; and
   performing the read operation on the first and second planes according to a result of the check and outputting the read data.

2. The method of claim 1, wherein the read address received is a MSB read address.

3. The method of claim 2, wherein checking whether an MSB program operation has been performed on each of the first and second planes is performed based on information read from a flag cell of each of the first and second planes.

4. The method of claim 2, further comprising:
   after receiving the MSB read address, performing the read operation on the first and second planes on a basis of a first read voltage for reading memory cells having a lowest threshold voltage distribution from among memory cells on which an MSB program operation has been performed; and
   storing the read data in respective page buffers of the first and second planes.

5. The method of claim 4, wherein performing the read operation on the first and second planes according to a result of the check and outputting the read data comprises:
   resetting the data stored in the page buffers; and
   outputting the reset data, if, as a result of the check, the MSB program operation has not been performed on both the first and second planes.

6. The method of claim 4, wherein performing the read operation on the first and second planes according to a result of the check and outputting the read data comprises performing the read operation on the first and second planes on a basis of a number of read voltages other than the first read voltage, if, as a result of the check, the MSB program operation has been performed on both the first and second planes.

7. The method of claim 4, wherein performing the read operation on the first and second planes according to a result of the check and outputting the read data comprises:
   performing the read operation on the second plane on a basis of a number of read voltages other than the first read voltage;
   outputting the read data;
   resetting the data stored in the page buffer of the first plane, and outputting the reset data, if, as a result of the check, the MSB program operation has not been performed on the first plane but has been performed on the second plane.

8. The method of claim 4, wherein performing the read operation on the first and second planes according to a result of the check and outputting the read data comprises:
   performing the read operation on the first plane on a basis of a number of read voltages other than the first read voltage;
   outputting the read data;
   resetting the data stored in the page buffer of the second plane; and
   outputting the reset data, if, as a result of the check, the MSB program operation has been performed on the first plane but has not been performed on the second plane.

9. The method of claim 2, wherein the MSB read address has a larger number of bits than an LSB read address.

10. The method of claim 1, wherein the read address received is a LSB read address.

11. The method of claim 10, wherein checking whether an MSB program operation has been performed on each of the first and second planes is performed based on information read from a flag cell of each of the first and second planes.

12. The method of claim 10, further comprising, after receiving the LSB read address, performing the read operation on the first and second planes on a basis of a second read voltage for reading data of LSB components from memory cells on which an MSB program operation has been performed and storing the read data in respective page buffers of the first and second planes.

13. The method of claim 12, wherein performing the read operation on the first and second planes according to a result of the check and outputting the read data comprises:

performing the read operation on the first and second planes on a basis of a read voltage for reading memory cells on which an LSB program operation has been performed; and outputting the read data, if, as a result of the check, the MSB program operation has not been performed on both the first and second planes.

14. The method of claim 12, wherein performing the read operation on the first and second planes according to a result of the check and outputting the read data comprises outputting the data stored in the page buffers of the first and second planes, if, as a result of the check, the MSB program operation has been performed on both the first and second planes.

15. The method of claim 12, wherein performing the read operation on the first and second planes according to a result of the check and outputting the read data comprises:

performing the read operation on the first plane on a basis of a read voltage for reading memory cells on which an LSB program operation has been performed;

outputting the read data; and outputting the data stored in the page buffer of the second plane, if, as a result of the check, the MSB program operation has not been performed on the first plane but has been performed on the second plane.

16. The method of claim 12, wherein performing the read operation on the first and second planes according to a result of the check and outputting the read data comprises:

the read operation on the second plane on a basis of a read voltage for reading memory cells on which an LSB program operation has been performed;

outputting the read data; and outputting the data stored in the page buffer of the first plane, if, as a result of the check, the MSB program operation has been performed on the first plane but has not been performed on the second plane.

17. The method of claim 10, wherein the LSB read address has a smaller number of bits than an MSB read address.

* * * * *